(12) United States Patent
Liu et al.

(10) Patent No.: US 9,243,317 B2
(45) Date of Patent: Jan. 26, 2016

(54) ELECTRONIC DEVICE HOUSING AND METHOD FOR MANUFACTURING SAME

(71) Applicants: SHENZHEN FUTAIHONG PRECISION INDUSTRY CO., LTD., Shenzhen (CN); FIH (Hong Kong) Limited, Kowloon (HK)

(72) Inventors: Xu Liu, Shenzhen (CN); Li-Hong Na, Shenzhen (CN)

(73) Assignees: SHENZHEN FUTAIHONG PRECISION INDUSTRY CO., LTD., Shenzhen (CN); FIH (Hong Kong) Limited, Kowloon (HK)

( * ) Notice: Subject to any disclaimer, the term of this patent is extended or adjusted under 35 U.S.C. 154(b) by 441 days.

(21) Appl. No.: 13/873,422

(22) Filed: Apr. 30, 2013

(65) Prior Publication Data

US 2014/0113089 A1     Apr. 24, 2014

(30) Foreign Application Priority Data

Oct. 18, 2012   (CN) .......................... 2012 1 03966999

(51) Int. Cl.
*C23C 14/20*   (2006.01)
*C23C 14/00*   (2006.01)

(52) U.S. Cl.
CPC .............. *C23C 14/20* (2013.01); *C23C 14/0015* (2013.01); *Y10T 428/1317* (2015.01); *Y10T 428/1355* (2015.01)

(58) Field of Classification Search
CPC .. C23C 14/20; C23C 14/0015; Y10T 428/13; Y10T 428/1355; Y10T 428/1317
See application file for complete search history.

(56) References Cited

U.S. PATENT DOCUMENTS

2010/0104833 A1*  4/2010  Li ........................... C09D 5/28
                                                           428/201

* cited by examiner

*Primary Examiner* — Michael C Miggins
(74) *Attorney, Agent, or Firm* — Novak Druce Connolly Bove + Quigg LLP

(57) ABSTRACT

A electronic device housing includes a substrate, and the electronic device housing further includes a first color layer, a metallic coating, a second color layer, and a second metallic coating formed directly on the substrate in that order. The first color layer is disposed on the substrate and covering portions of the internal surface. The first metallic coating is formed on the first color layer and completely covers the first color layer. The second color layer is formed on the first metallic coating and directly covers the portions of the internal surface which is uncovered by the first color layer. The second color layer and the first color layer have different colors. The second color layer and the first color layer are transparent or translucent. A method for manufacturing the electronic device housing is also provided.

15 Claims, 1 Drawing Sheet

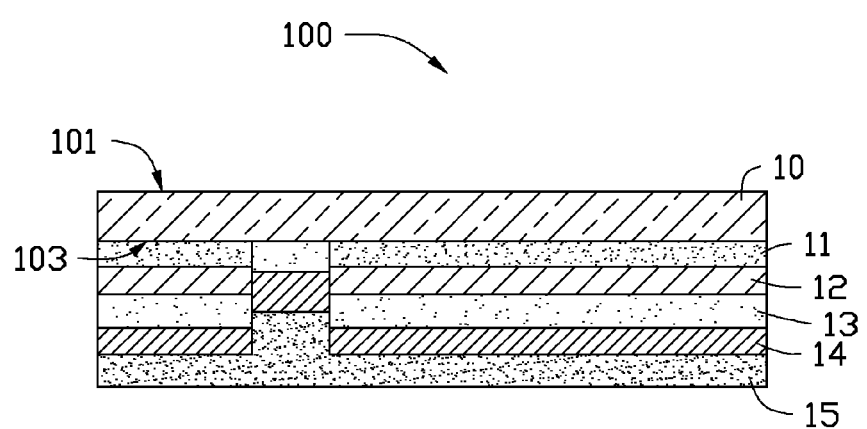

ELECTRONIC DEVICE HOUSING AND METHOD FOR MANUFACTURING SAME

BACKGROUND

1. Technical Field

The present disclosure relates to an electronic device housing, and a method for manufacturing the electronic device housing.

2. Description of Related Art

Metallic coatings are widely deposited on plastic electronic device housings by physical vapor deposition (PVD) to decorate the electronic device housings. However, the metallic coatings are prone to peel off from the device housings after a period of time, which negatively affect the appearance of the electronic device housing(s).

Therefore, there is room for improvement within the art.

BRIEF DESCRIPTION OF THE DRAWINGS

Many aspects of the embodiment can be better understood with reference to the following drawings. The components in the drawings are not necessarily drawn to scale, the emphasis instead being placed upon clearly illustrating the principles of the exemplary disclosure. Moreover, in the drawings like reference numerals designate corresponding parts throughout the several views.

The FIGURE is a cross-sectional view of an exemplary embodiment of an electronic device housing.

DETAILED DESCRIPTION

The FIGURE shows an electronic device housing 100 according to an exemplary embodiment. The electronic device housing 100 includes a substrate 10, a first color layer 11, a first metallic coating 12, a second color layer 13, a second metallic coating 14, and a protecting layer 15 formed directly on the substrate 10 in that order.

The substrate 10 is transparent. The substrate 10 may be made of plastic and is formed by injecting molding. The substrate 10 includes an external surface 101 and an internal surface 103 opposite to the external surface 101. Alternately, the substrate 10 may be made of glass.

The first color layer 11 is formed directly on the internal surface 103 and covers portions of the internal surface 103. The first color layer 11 may be made of transparent or translucent paint with any color. The first color layer 11 has a thickness of about 6 micrometer (μm) to about 12 μm. The first color layer 11 provides a background color to the electronic device housing 100.

The first metallic coating 12 is formed directly on the first color layer 11 and completely covers the first color layer 11. The first metallic coating 12 is made of metal to provide the electronic device housing 100 a metallic appearance.

The first metallic coating 12 is silvery white. The first metallic coating 12 is made of at least one metal/metal alloy selected from the group of indium, tin, indium tin alloy, stainless steel, and aluminum. The first metallic coating 12 is a non-conductive vacuum metalizing (NCVM) coating, thus the first metallic coating 12 does not affect the transmition and receipt of radio frequency signals of the electronic device housing 100. The first metallic coating 12 has a thickness of about 0.1 μm to about 0.5 μm.

The second color layer 13 is directly formed on the first metallic coating 12, and directly covers portions of the internal surface 103 which is uncovered by the first color layer 11.

The second color layer 13 may be made of transparent or translucent paint with any color. The second color layer 13 has a thickness of about 6 μm to about 12 μm. The color of the second color layer 13 is different from the color of the first color layer 11. Portions of the second color layer 13 directly disposed on the internal surface 103 define a desired pattern.

The second metallic coating 14 is directly formed on the second color layer 13 and completely covers the second color layer 13. The second metallic coating 14 is made of metal to provide the electronic device housing 100 a metallic appearance.

The second metallic coating 14 is silvery white. The second metallic coating 14 is made of at least one metal/metal alloy selected from the group of indium, tin, indium tin alloy, stainless steel and aluminum. The second metallic coating 14 is a NCVM coating, thus the first metallic coating 12 does not affect the transmition and receipt of radio frequency signals of the electronic device housing 100. The second metallic coating 14 has a thickness of about 0.1 μm to about 0.5 μm.

The protecting layer 15 is formed directly on the second metallic coating 14 to prevent the first color layer 11, the first metallic coating 12, the second color layer 13 and the second metallic coating 14 from damage. The protecting layer 15 is made of paint or ink. The protecting layer 15 has a thickness of about 15 μm to about 20 μm.

Since the substrate 10 is transparent, pattern defined by the second color layer 13 can be seen from the external surface 101. Furthermore, since the first color layer 11 and the second color layer 13 are transparent or translucent, the first metallic coating 12 and the second metallic coating 14 provide a metallic appearance to the electronic device housing 100.

A method for manufacturing the electronic device housing 100 includes the following steps:

The substrate 10 is provided. The substrate 10 is transparent. The substrate 10 may be made of plastic and is formed by injecting molding. The substrate 10 includes an external surface 101 and an internal surface 103 opposite to the external surface 101.

The first color layer 11 is formed directly on the internal surface 103 by painting or spraying using transparent/translucent colored paint.

The first metallic coating 12 is formed directly on the first color layer 11 and completely covers the first color layer 11. The first metallic coating 12 may be formed by physical vapor deposition (such as magnetron sputtering or vacuum evaporation) using indium, tin, indium tin alloy, stainless steel and/or aluminum as a target. In the embodiment, the first metallic coating 12 is deposited by vacuum evaporation.

Portion of the first metallic coating 12 and portions of the first color layer 11 is laser engraved.

A second color layer 13 is formed on the internal surface 103 by spraying or printing using a transparent/translucent colored paint with any color. The second color layer 13 is directly formed on the first metallic coating 12, and directly covers portions of the internal surface 103 which is uncovered by the first color layer 11.

The second metallic coating 14 is formed directly on the second color layer 13 and completely covers the second color layer 13 by physical vapor deposition using indium, tin, indium tin alloy, stainless steel and/or aluminum as a target. In the embodiment, the second metallic coating 14 is deposited by vacuum evaporation.

The protecting layer 15 is formed directly on the second metallic coating 14 by spraying or printing.

It is to be understood, however, that even through numerous characteristics and advantages of the exemplary disclosure have been set forth in the foregoing description, together with details of the system and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An electronic device housing comprising:
    a substrate, the substrate being transparent, the substrate comprising an external surface and an internal surface opposite to the external surface;
    a first color layer disposed on the substrate and covering portions of the internal surface;
    a first metallic coating disposed on the first color layer and completely covering the first color layer; and
    a second color layer formed on the first metallic coating and directly covering the portions of the internal surface which is uncovered by the first color layer, the second color layer and the first color layer having different colors, the second color layer and the first color layer being transparent or translucent.

2. The electronic device housing of claim 1, wherein the second color layer further comprise portions which are directly formed on the first metallic coating.

3. The electronic device housing of claim 1, wherein the substrate is made of plastic or glass.

4. The electronic device housing of claim 1, wherein the first color layer and the second color layer are made of colored paint.

5. The electronic device housing of claim 1, wherein the first metallic coating and the second metallic coating are silvery white.

6. The electronic device housing of claim 1, wherein the second color layer has a thickness of about 6 μm to about 12 μm.

7. The electronic device housing of claim 1, wherein the first metallic coating and the second metallic coating are made of at least one metal/metal alloy selected from the group consisting of indium, tin, indium tin alloy, stainless steel, and aluminum.

8. The electronic device housing of claim 7, wherein the first metallic coating and the second metallic coating are non-conductive vacuum metalizing coatings.

9. The electronic device housing of claim 8, wherein the first metallic coating or the second metallic coating has a thickness of about 0.1 μm to about 0.5 μm.

10. The electronic device housing of claim 1, further comprising a protecting layer formed on the second metallic coating.

11. The electronic device housing of claim 10, wherein the protecting layer has a thickness of about 15 μm to about 20 μm.

12. The electronic device housing of claim 10, wherein the protecting layer is made of paint or ink.

13. A method for manufacturing a electronic device housing, comprising:
    providing a substrate, the substrate being transparent, the substrate comprising an external surface and an internal surface opposite to the external surface;
    forming a first color layer on the internal surface by painting or spraying, the first color layer being transparent or translucent;
    depositing a first metallic coating on the first color layer by physical vapor deposition;
    laser engraving portions of the first metallic coating and portions of the first color layer corresponding to the portions of the first metallic coating;
    forming a second color layer on the first metallic coating by painting or spraying, the second color layer being transparent or translucent, the second color layer and the first color layer having different colors; and
    depositing a second metallic coating on the second color layer by physical vapor deposition.

14. The method of claim 13, wherein the first metallic coating and the second metallic coating are formed by vacuum evaporation using indium, tin, indium tin alloy, stainless steel and/or aluminum as a target.

15. The method of claim 13, further comprising a step of forming a protecting layer on the second metallic coating by painting or spraying.

* * * * *